(12) United States Patent
Choi

(10) Patent No.: US 7,315,476 B2
(45) Date of Patent: Jan. 1, 2008

(54) SYSTEM AND METHOD FOR COMMUNICATING INFORMATION TO A MEMORY DEVICE USING A RECONFIGURED DEVICE PIN

(75) Inventor: Joo S. Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/340,899

(22) Filed: Jan. 27, 2006

(65) Prior Publication Data

US 2006/0120131 A1 Jun. 8, 2006

Related U.S. Application Data

(62) Division of application No. 10/789,673, filed on Feb. 27, 2004, now Pat. No. 7,158,422.

(51) Int. Cl.
*G11C 7/10* (2006.01)
(52) U.S. Cl. .................. 365/189.03; 365/194; 365/211
(58) Field of Classification Search ........... 365/189.03, 365/194, 211
See application file for complete search history.

(56) References Cited

U.S. PATENT DOCUMENTS

| | | | |
|---|---|---|---|
| 5,278,796 A | 1/1994 | Tillinghast et al. ......... 365/211 |
| 5,680,359 A | 10/1997 | Jeong ......................... 365/222 |
| 5,784,328 A | 7/1998 | Irrinki et al. ............... 365/222 |
| 6,002,627 A | 12/1999 | Chevallier ................... 365/212 |
| 6,438,057 B1 * | 8/2002 | Ruckerbauer ............... 365/222 |
| 6,453,218 B1 | 9/2002 | Vergis ........................ 700/299 |
| 6,552,945 B2 | 4/2003 | Cooper et al. .............. 365/212 |
| 6,564,288 B2 | 5/2003 | Olarig et al. ............... 711/105 |
| 6,691,214 B1 * | 2/2004 | Li et al. ..................... 711/167 |
| 6,937,077 B2 * | 8/2005 | Zarate et al. ............... 327/158 |
| 6,965,262 B2 * | 11/2005 | Zerbe ......................... 327/336 |
| 7,024,502 B2 * | 4/2006 | Horowitz et al. ........... 710/104 |

* cited by examiner

*Primary Examiner*—Tuan T. Nguyen
(74) *Attorney, Agent, or Firm*—Dorsey & Whitney LLP

(57) ABSTRACT

System and method for communicating information to and from memory devices. In one embodiment, the invention includes a memory system having a memory device having at least one extraneous device pin, a memory controller configured to control the memory device and a signal path extending between the memory device and the controller that includes the at least one extraneous device pin, the signal path being operable to a transfer a selected memory system characteristic between the controller and the memory device.

2 Claims, 5 Drawing Sheets

SYSTEM AND METHOD FOR COMMUNICATING INFORMATION TO A MEMORY DEVICE USING A RECONFIGURED DEVICE PIN

CROSS-REFERENCE TO RELATED APPLICATION

This application is a divisional of U.S. patent application Ser. No. 10/789,673, filed Feb. 27, 2004 now U.S. Pat. No. 7,158,422.

TECHNICAL FIELD

The present invention is generally directed to semiconductor memory devices, and more particularly, to communicating information to and from the memory device.

BACKGROUND OF THE INVENTION

Semiconductor memory devices constitute an essential part of computer systems due to the relatively high access speeds obtainable and the generally low cost of such devices. One type of semiconductor memory device that is particularly advantageous is the dynamic random access memory (DRAM), which provides a relatively high memory density while also providing the lowest cost per bit of any memory device currently available. DRAMs include a single transistor and capacitor for each memory cell in a conventional memory cell array structure. Briefly, and in general terms, a logic state is stored in each memory cell of a DRAM by maintaining the capacitor in a charged state corresponding to a logic '1' state, or in a discharged state, corresponding to a logic '0' state. The transistor is operatively coupled to the capacitor and acts as a switch to control the charging and discharging of the capacitor. Since the capacitor may lose charge through capacitor leakage, a particular shortcoming present in DRAM devices is that the charge on the capacitor must be periodically refreshed in order to maintain an acquired logic state.

Since DRAMs generally provide high memory density, DRAMs usually require a package having a relatively large number of pins in order to communicate signals from the DRAM to external circuits. For example, in a 32 Mb×4 DRAM device, 25 address lines and four data input/output pins are required. In addition, other pins are also required for the operation of the DRAM memory device, including row address strobe (RAS) and column address strobe (CAS) pins, a write enable (WE) pin, and power supply and ground connection pins ($V_{cc}$ and $V_{ss}$) among other pins. Since the number of pins generally adversely affects the size of the DRAM device package, and correspondingly increases the amount of "real estate" required on a supporting circuit board, if one or more device pins present on a device package are not used, it would be advantageous to reconfigure the pin so that it may be used for a different purpose. For example, a number of DRAM devices include a data mask (DM) pin, which is not used in certain DRAM devices.

One possible use for an unused memory device pin that is to communicate a temperature value associated with the memory device to an external controller. For example, it has been observed that the refresh time for a DRAM memory cell varies inversely in proportion to the temperature of the cell, so that as the memory cell increases in temperature, it will require more frequent refreshment. Typically, the memory cell is refreshed at a frequency that corresponds to the highest cell temperature anticipated in service. As a result, if the memory cell operates at temperature that is significantly lower than the highest anticipated temperature, it will be refreshed more frequently than necessary. Since the time consumed by refresh operations decreases the time available for accessing information stored in the memory device, memory devices that are refreshed more frequently than necessarily generally decrease the operating speed of systems using the memory device.

Another possible use for an unused memory device pin is to communicate parity check information from the memory device to an external circuit. Briefly, parity is an error detection procedure that is used to verify the integrity of digital data following a read operation. In general, a parity check includes appending an additional parity bit to each byte that reflects the number of ones present in the byte, which may be either even or odd. The parity check then proceeds by reading the byte and generating a new parity bit. The newly generated parity bit may then be compared to the parity of the bit appended to the byte. If the generated bit and the appended bit do not favorably agree, an error is indicated.

Still another possible use for an unused memory device pin is to communicate system channel information from a memory device to an external circuit. In general, before a read or write operation occurs in a memory device, the device receives a plurality of control signals in synchronization with pulses from a system clock. In response, a read or write operation occurs so that data is transferred in synchronization with the clock and within a prescribed data window, or "data eye". In many cases, however, data may at least partially drift outside the data eye due to signal reflection, inductive cross talk between adjacent signal lines, variations in supply voltage, and noise due to thermal or other effects.

As a result, there is a need to provide a way to reconfigure selected pins on a semiconductor memory device to transfer data of various types. In particular, pins that are extraneous or otherwise unused on existing microelectronic memory devices may advantageously reconfigured to accomplish this purpose.

SUMMARY OF THE INVENTION

The present invention is generally directed to communicating information to and from memory devices. In one aspect, the invention includes a memory system having a memory device having at least one extraneous device pin, a memory controller configured to control the memory device and a signal path extending between the memory device and the controller that includes the at least one extraneous device pin, the signal path being operable to a transfer a selected memory system characteristic between the controller and the memory device.

DETAILED DESCRIPTION OF THE INVENTION

The present invention is generally directed to a semiconductor memory device having reconfigured pins to communicate information to and from the memory device. Many of the specific details of certain embodiments of the invention are set forth in the following description and in FIGS. 1 to 5 to provide a thorough understanding of such embodiments. One skilled in the art will understand, however, that the present invention may be practiced without several of the details described in the following description. Moreover, in the description that follows, it is understood that well-known circuits, control signals, timing protocols and software operations have not been shown in detail, or have been omitted entirely to avoid unnecessarily obscuring the invention. In particular, it is understood without further disclosure that memory devices may include one or more memory cell arrays arranged in a manner well known in the art, and may also include decoders, buffers, sense amplifiers, control circuitry and other circuitry as required.

Figure 1:
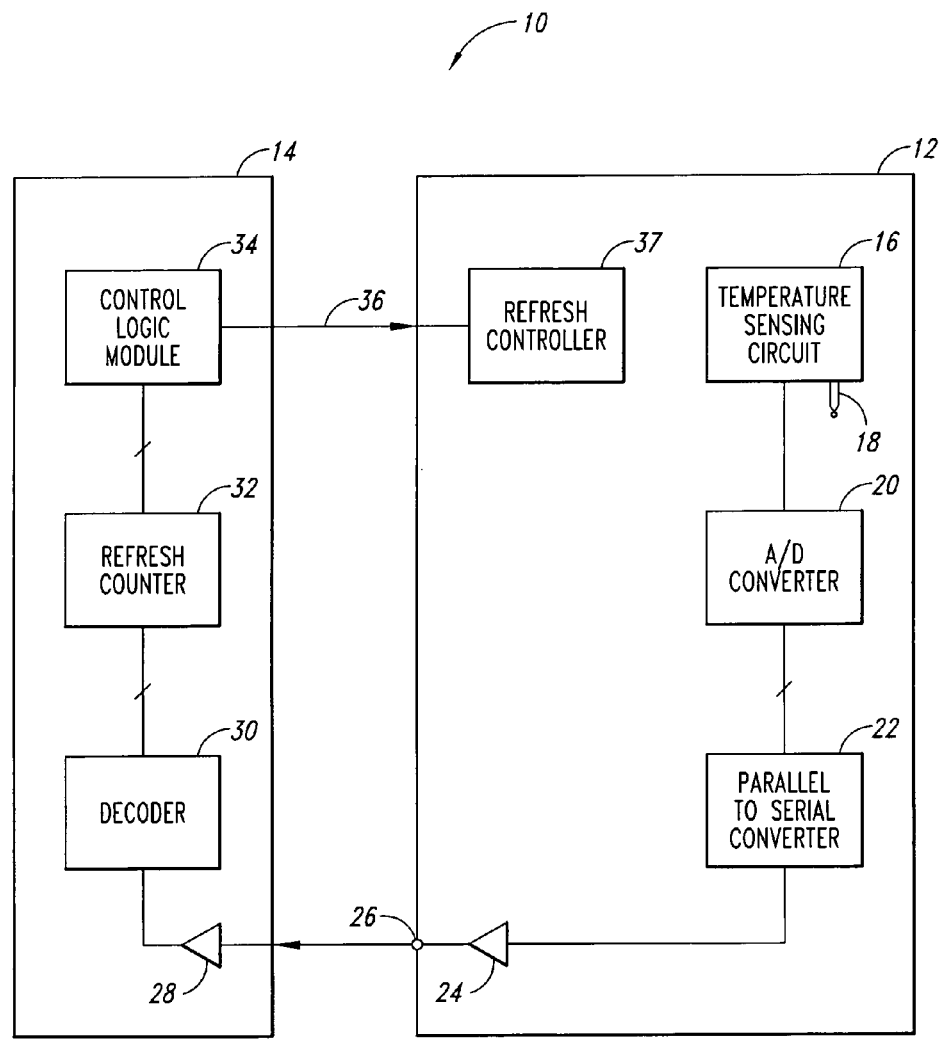
FIG. 1 is a functional block diagram of a memory system according to an embodiment of the invention.

FIG. 1 is a functional block diagram of a memory system 10 according to an embodiment of the invention. The system 10 includes a memory device 12 that is coupled to a memory controller 14. The memory device 12 of FIG. 1 is exemplary, and in the specific embodiment shown in FIG. 1, the memory device 12 corresponds to a DRAM. It is understood, however, that the memory device 12 may include other well-known memory devices. It will also be apparent that for clarity and simplicity, various components and interconnections are not shown. Such components and interconnections are generally well known and well within the knowledge of those skilled in the art. The memory device 12 includes a temperature sensing circuit 16 that is coupled to a sensor 18. The sensor 18 may be comprised of any commonly available sensing devices. For example, the sensor 18 may include a thermocouple junction, or a resistance temperature device (RTD). Alternately, the sensor 18 may be a semiconductor-based device, such as a thermistor. The temperature sensing circuit 16 includes devices well-known in the art that convert relatively small voltages and/or resistances generated by the sensor 18 into an analog temperature signal having a suitable level that may be transferred to an analog-to-digital (A/D) converter 20. The A/D converter 20 may comprise any suitable A/D device known in the art to convert the analog temperature signal generated by the circuit 16 into a digital signal, but in a particular embodiment is a successive approximation device. The digital temperature signal generated by the A/D converter 20 may be transferred to a parallel-to-serial converter 22 along a parallel data line that couples the A/D converter 20 to the parallel-to-serial converter 22. The parallel-to-serial converter 22 is operable to convert the digital temperature signal to a serial format and to transfer the serial-formatted signal to a driver 24 that is coupled to an unused pin 26.

Still referring to FIG. 1, the serial-formatted signal may be transmitted to a receiver 28 positioned within the controller 14, and subsequently transferred to a decoder 30 that converts the digital signal into a form suitable for processing within a refresh counter 32. For example, the decoder 30 may be operable to convert the serial-formatted signal into a signal suitable for transmission along a parallel data line. The refresh counter 32 is operable to determine a refresh interval suitable for the memory array (not shown) in the memory device 12. In contrast to prior art memory devices having a fixed refresh interval, the refresh counter 32 is configured to permit the refresh interval to be continuously variable based upon the temperature information transferred to the counter 32. The refresh interval generated by the refresh counter 32 may then be transferred to a control logic module 34 that, in turn, generates a refresh command signal 36 that is transferred to a refresh controller 37 within the memory device 12.

Figure 2:
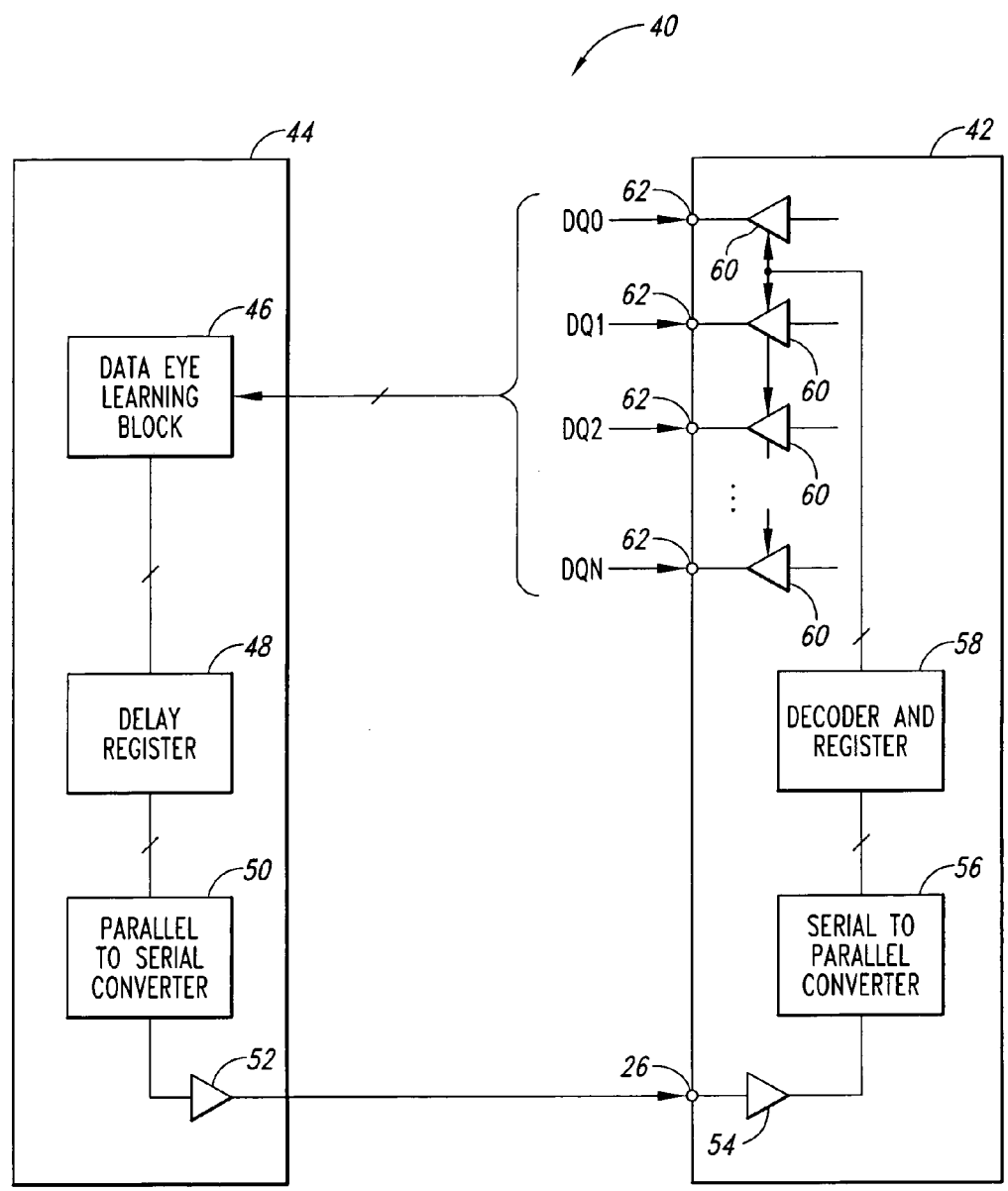
FIG. 2 is a functional block diagram of a memory system according to another embodiment of the invention.

FIG. 2 is a functional block diagram of a memory system 40 according to another embodiment of the invention. The system 40 includes a memory device 42 that is coupled to a memory controller 44. As in the previous embodiment, the memory device may be a DRAM, or other memory devices known in the art. The memory controller 44 includes a data eye learning block 46 that is operable to determine time delay intervals that may be applied to read/write sequences for proper data centering. As discussed in more detail above, read and/or write operations from the memory device 42 must be properly synchronized with a system clock as data is interchanged between the memory device 42 and other external circuits. In particular, the data to be transferred must be properly centered between pulses of the system clock in a prescribed data window or "data eye" order to be properly transmitted. For various reasons, data may drift relative to the data eye so that the data is no longer properly centered. For example, reflected signals due to an impedance mismatch may cause the data to be skewed relative to the data eye. Inductive cross-talk, temperature variations and supply voltage variations may also cause the data to drift relative to the data eye. The operation of the data eye learning block 46 will be discussed in greater detail below.

Still referring to FIG. 2, the memory controller 44 also includes a delay register 48 that is coupled to the data eye learning block 46 that is configured to receive and store the time delay intervals generated by the data eye learning block 46. Although the delay register 48 is coupled to the data eye learning block 46 by a parallel input line so that the delay register 48 is a parallel-input register, one skilled in the art will readily recognize that the delay register 48 may also include a serial-input register that is coupled to the data eye learning block 46 by a serial input line. Further, one skilled in the art will readily understand that the delay register 48 may also be configured to have a serial output. The delay register 48 may be further coupled to a parallel-to-serial converter 50 that is operable to convert parallel data to serial data when the delay register 48 is configured to provide a serial-formatted output. The parallel-to-serial converter 50 is coupled to the memory device 42 through the unused pin 26. The memory device 42 also includes a receiver 54 operable coupled to the pin 26 and operable to transfer time delay interval data from the pin 26 to a serial-to-parallel converter 56. A decoder and register 58 is coupled to the serial-to-parallel converter 56 that is operable to store the time delay interval data and to convert the coded data into another coded form, or even a non-coded form. The decoder and register 58 is further coupled to a plurality of drivers 60 that are coupled to device data pins 62. Accordingly, time delay interval data may be applied to the data DQ0-DQn that is transferred to and/or from the memory device 42.

Figure 3:
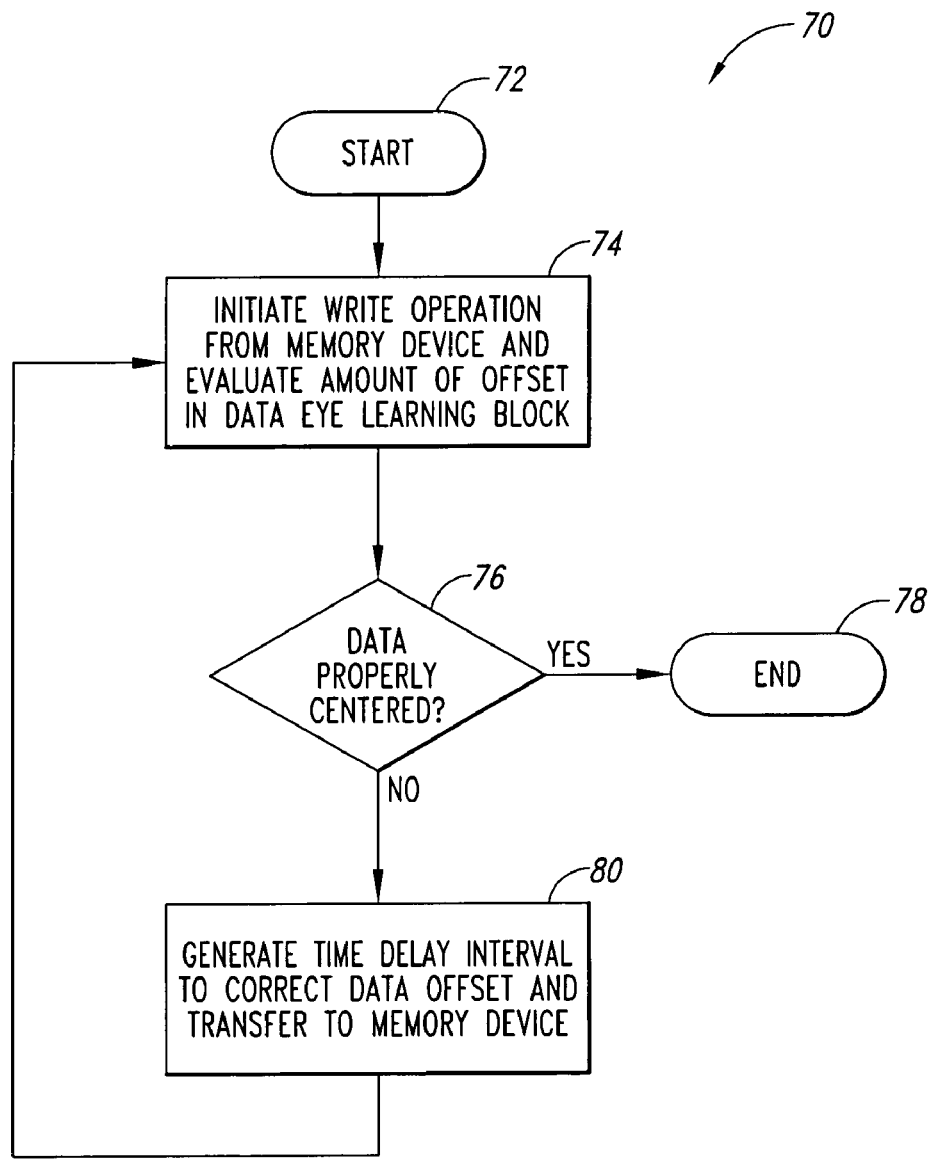
FIG. 3 is a flow diagram showing a method for generating a time delay interval for the memory system of FIG. 2.

The operation of the memory system of FIG. 2 will now be discussed in detail. In particular, and with reference still to FIG. 2 and also to FIG. 3, the generation of the time delay interval data by the data eye learning block 46 will be described. FIG. 3 is a flow diagram that shows a method 70 for generating time delay interval data. The method 70 commences with a start step 72. Since the controller must have possession of time delay interval data before the system 40 of FIG. 2 engages in normal memory operations in connection with any associated processing system, the step 72 is generally coincident with an initialization or "boot" procedure performed by the processing system. At step 74, the controller 44 of the system 40 initiates a write operation from the memory device 42 in order to evaluate the degree of offset of the data from the data eye. Accordingly, data DQ0-DQn that is output at the data pins 62 is transferred to the data eye learning block 46 for this evaluation, which occurs at step 76. If the data DQ0-DQn is at least approximately properly centered, the method 70 terminates at an end step 78, so that no time delay interval is applied to the data DQ0-DQn during data transfer. Alternatively, if the data DQ0-DQn is not at least approximately properly centered, the data eye learning block 46 generates a first approximation for a time delay interval and transfers the first approximation to the memory device 42, as shown in step 80. The method 80 then returns to step 74 to repeat the procedure, which recursively determines an optimized value for the time delay interval. One skilled in the art will readily appreciate that various well-known optimization techniques, such as linear programming methods, may be employed to assure convergence on an optimum value for the time delay interval data.

Figure 4:
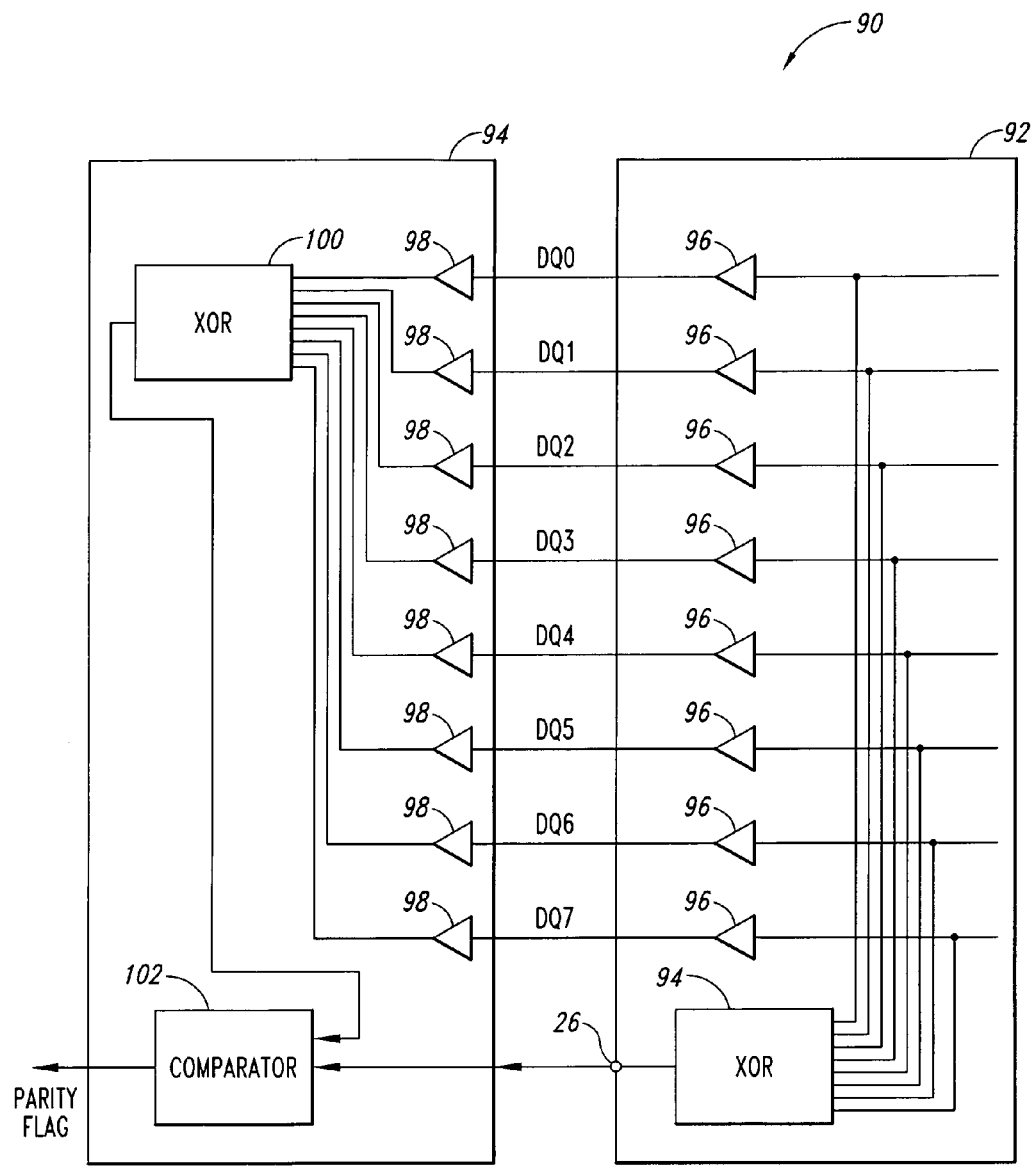
FIG. 4 is a functional block diagram of a memory system according to still another embodiment of the invention.

FIG. 4 is a functional block diagram of a memory system 90 according to another embodiment of the invention. The system 90 includes a memory device 92 that is coupled to a memory controller 94. In one particular embodiment, the memory device 92 may be a DRAM, while in other particular embodiments, the device 92 may be still other memory devices, which are well known in the art. In any case, the memory device 92 includes a first exclusive-or (XOR) gate 94 that is coupled to data lines DQ0-DQ7 within the memory device 92, and is configured to determine a first parity state for the data on the data lines DQ0-DQ7 by successive comparison of the logic states on the data lines DQ0-DQ7. The memory device 92 also includes a plurality of drivers 96 that are coupled to the data lines DQ0-DQ7 that are operable to transfer the data on the lines DQ0-DQ7 to corresponding receivers 98 in the memory controller 94. The first XOR gate 94 is coupled to the pin 26 so that the first parity state may be transferred to the controller 94.

Still referring to FIG. 4, the memory controller 94 further includes a second XOR gate 100 that is coupled to the data lines DQ0-DQ7 to determine a second parity state by successive comparison of the logic states on the data lines DQ0-DQ7. As discussed more fully above, a parity check generally proceeds by comparing the logic state of a parity and generating a new parity bit after the data has been read. The logic state of the first parity bit may then be compared to the logic state second parity bit. If the first and the second parity bits do not favorably agree, an error condition is indicated. Accordingly, the controller 94 includes a comparator 102 that receives the first parity bit from the first XOR gate 94 through the pin 26. The comparator 102 also receives the second parity bit from the second XOR gate 100 and compares the logic state of the first parity bit to the logic state of the second bit. If the results do not agree, a parity flag is generated by the comparator 102. In one particular embodiment, the comparator 102 may be an exclusive-nor (XNOR) gate, although other logical devices may be used to compare the logic states of the first and second parity bits.

Figure 5:
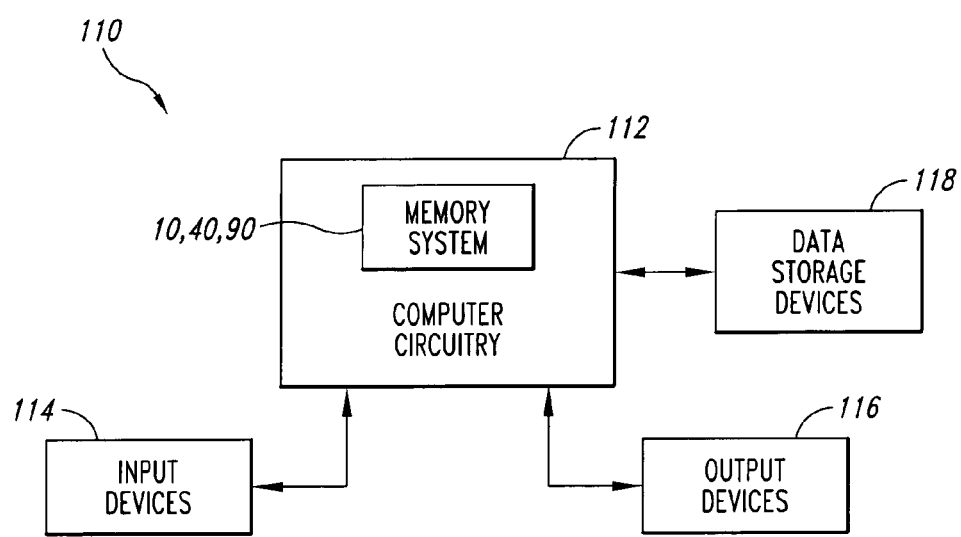
FIG. 5 is a block diagram of a computer system according to yet another embodiment of the invention.

FIG. 5 is a block diagram of a computer system 110 including computer circuitry 112 that is coupled to at least one of the memory system 10 of FIG. 1, the memory system 40 of FIG. 2 and the memory system 90 of FIG. 4. In particular, the computer circuitry 112 is coupled to respective memory controllers 14, 44 and 94 (as shown in FIGS. 1, 2 and 4, respectively) through address, data, and control busses to provide for writing data to and reading data from the respective memory devices 12, 42 and 92 (as is also shown in FIGS. 1, 2 and 4, respectively). The computer circuitry 112 also includes circuitry for performing various processing functions such as executing specific software to perform specific calculations or tasks. In addition, the computer system 100 includes one or more input devices 114, such as a keyboard or a mouse that is coupled to the computer circuitry 112 to allow an operator to interact with the computer system 110. Typically, the computer system 110 also includes one or more output devices 116 coupled to the computer circuitry 112. For example, typical output devices may include a printer and a video terminal. One or more data storage devices 118 are also generally coupled to the computer circuitry 112 to store data or retrieve data from external storage media (not shown). Examples of typical storage devices 118 include hard and floppy disks, tape cassettes, compact disk read-only (CD-ROMs) and compact disk read-write (CD-RW) memories, and digital video disks (DVDs), as well as other storage devices known in the art.

From the foregoing it will be appreciated that, although specific embodiments of the invention have been described herein for purposes of illustration, various modifications may be made without deviating from the spirit and scope of the invention. For example, certain features shown in the context of one embodiment of the invention may be incorporated into other embodiments as well. Accordingly, the invention is not limited by the foregoing description of embodiments except as by the following claims.

The invention claimed is:

1. A method of communicating a selected memory system characteristic in a memory system having a memory controller and a memory device, comprising:
   identifying an extraneous device pin coupled to the memory device;
   forming a signal path between the controller and the memory device that includes the extraneous device pin;
   communicating the selected characteristic on the signal path; and
   wherein communicating the selected characteristic further comprises communicating a time delay interval operable to at least approximately center data transferred to and from the memory device within a data eye.

2. A method of communicating a selected memory system characteristic in a memory system having a memory controller and a memory device, comprising:
   identifying an extraneous device pin coupled to the memory device;
   forming a signal path between the controller and the memory device that includes the extraneous device pin;
   communicating the selected characteristic on the signal path; and
   wherein communicating the selected characteristic further comprises communicating a parity bit generated within the memory device.

* * * * *